(12) United States Patent
Baek et al.

(10) Patent No.: US 6,320,362 B1
(45) Date of Patent: Nov. 20, 2001

(54) PASSIVE AUXILIARY CIRCUIT FOR SERIES CONNECTION OF A POWER SWITCH

(75) Inventors: Ju Won Baek; Dong Wook Yoo, both of Kyungsangnam-do (KR)

(73) Assignee: Korea Electrotechnology Research Institute, Kyungsangnam-do (KR)

( * ) Notice: Subject to any disclaimer, the term of this patent is extended or adjusted under 35 U.S.C. 154(b) by 0 days.

(21) Appl. No.: 09/721,983

(22) Filed: Nov. 27, 2000

(30) Foreign Application Priority Data

Nov. 26, 1999 (KR) .................................................. 99/53056

(51) Int. Cl.[7] ....................................................... G05F 1/40
(52) U.S. Cl. ............................................ 323/289; 323/281
(58) Field of Search .................................. 323/224, 225, 323/226, 281, 276, 289

(56) References Cited

U.S. PATENT DOCUMENTS 4,638,240 * 1/1987 Pauker et al. ......................... 323/289

* cited by examiner

*Primary Examiner*—Shawn Riley
(74) *Attorney, Agent, or Firm*—Arent Fox Kintner Plotkin & Kahn PLLC

(57) ABSTRACT

The present invention relates to a passive auxiliary circuit for driving power switches connected in series for much higher rating of a power system. The passive auxiliary circuit for an IGBT power switch connected in series with another, comprises two capacitors, which are connected in series across the IGBT; two resistors dividing a voltage applied across the IGBT, each resistor being connected in parallel with each capacitor; and a diode and a third resistor which are connected in series between a gate terminal of the IGBT and a node connecting the two capacitors, wherein the diode is placed such that its cathode is directed to the gate. This passive auxiliary circuit, whose structure is so simple, is able to distribute a supplied high voltage equally over series-connected IGBTs, to reduce additional power loss remarkably, and to relieve transient overvoltage like as a conventional active gate circuit.

6 Claims, 5 Drawing Sheets

Conventional Art mode M1 mode M2 mode M3 mode M4

PASSIVE AUXILIARY CIRCUIT FOR SERIES CONNECTION OF A POWER SWITCH

BACKGROUND OF THE INVENTION

1. Field of the Invention

The present invention relates to a passive auxiliary circuit for driving power switching elements connected in series for much higher rating of a power system.

2. Description of the Related Art

High voltage and current rating solid state switches are being used as devices for high voltage power system owing to development of solid state electronic device technology. Among solid state switches, an IGBT (Insulated Gate Bipolar Transistor) can operate at fast switching frequency and its driving circuit is so simple. In addition, the rating of an IGBT is higher than that of a MOSFET (Metal Oxided Semiconductor Field Effect Transistor). Therefore, an IGBT is replacing a thyristor and a GTO (Gate Turn Off) thyristor gradually in high-capacity power system as well as middle-capacity one.

However, an IGBT being used commonly at present has the rating of 3.3 kV/1200 A, so that, if the rating does not match the need for any several order kilovolt high voltage application such as a high-voltage pulse generator, a static var compensator, a high-voltage source inverter, and so on, several IGBTs should be connected in series for that need. Due to this reason, series connection methods of power semiconductor switches have been introduced in many papers recently.

When a plurality of power switches are to be connected in series for a high voltage application, it is very important to distribute the high voltage across all switches equally in order that an overvoltage exceeding a rating voltage of a single switch should not be applied across an arbitrary switch. Especially, since the characteristic difference is very large between each IGBT at the time when it is turned off, an IGBT may be destroyed if an overvoltage is applied due to the unbalance of voltage distribution.

To resolve such problems, various auxiliary circuits including passive elements only or active elements have been designed so far. FIG. 1 shows a passive snubber circuit composed of a resistor Rs, a capacitor Cs, and a diode Ds, and FIG. 2 shows a power circuit including an active gate driving circuitry. In the circuit of FIG. 2, each voltage across each switching element is detected and is compared with a predetermined reference, then, the gate driving circuitry is controlled based on the comparison result.

The voltage distributing method according to the snubber circuit of FIG. 1 has such drawbacks that the size of a circuit is increased since the capacitance of the snubber capacitor Cs should be increased if a switching element is for high voltage, and a power loss is much large in proportion to switching frequency. Therefore, the method using a passive snubber circuit is not applicable to higher-capacity and higher-frequency power circuit because of much power loss.

The method using an active gate driving circuitry of FIG. 2 has advantages over the method of a passive snubber circuit in that the switching power loss is negligible and its operation is more reliable. However, a power circuit including the active gate driving circuitry becomes more complex if it has to comprise more switching elements to be connected in series since additional circuits for detection, comparison, and control are added to each switching element, which causes a reliability and insulation problem of an overall power circuit.

Besides the passive and the active circuits shown in FIGS. 1 and 2, various technologies for series connection between solid state power switches has been presented, however they still have disadvantages that the circuit structure is complicated and power loss is not negligible.

SUMMARY OF THE INVENTION

It is an object of the present invention to provide a passive auxiliary circuit for series connection of a solid state power switch, which has simple structure composed of small-capacity passive elements and is able to distribute a supplied high voltage equally across a plurality of semiconductor switches connected in series in a high-rating power supplying system.

A passive auxiliary circuit for series-connection of a semiconductor power switch according to the present invention, comprises two capacitors, which are connected in parallel across the power switch; two resistors dividing a voltage applied across the power switch, each resistor being connected in parallel with each of the capacitors; and a diode and a third resistor which are connected in series between a driving terminal of the power switch and a node connecting the two capacitors, wherein the diode is placed such that its cathode is directed to the driving terminal.

Another passive circuit for series-connection of a semiconductor power switch according to the present invention, comprises two capacitors, which are connected in series across the power switch; two resistors dividing a voltage applied across the power switch, each resistor being connected in parallel with each of the capacitors; a third resistor connected between a driving terminal of the power switch and a node connecting the two capacitors; and a diode inserted into a branch between a current inflow terminal of the power switch and one of the capacitors, wherein the diode is placed such that its anode is directed to the current inflow terminal.

BRIEF DESCRIPTION OF THE DRAWINGS

The accompanying drawings, which are included to provide a further understanding of the invention, illustrate the preferred embodiments of the invention, and together with the description, serve to explain the principles of the present invention.

In the drawings:

FIG. 6 shows series-connected power switches which the passive auxiliary circuits presented in FIG. 3 are added to;

FIG. 8 shows series-connected power switches which the passive auxiliary circuit presented in FIG. 7 are added to.

DETAILED DESCRIPTION OF THE PREFERRED EMBODIMENT

In order that the invention may be fully understood, preferred embodiments thereof will now be described with reference to the accompanying drawings.

Figure 1:
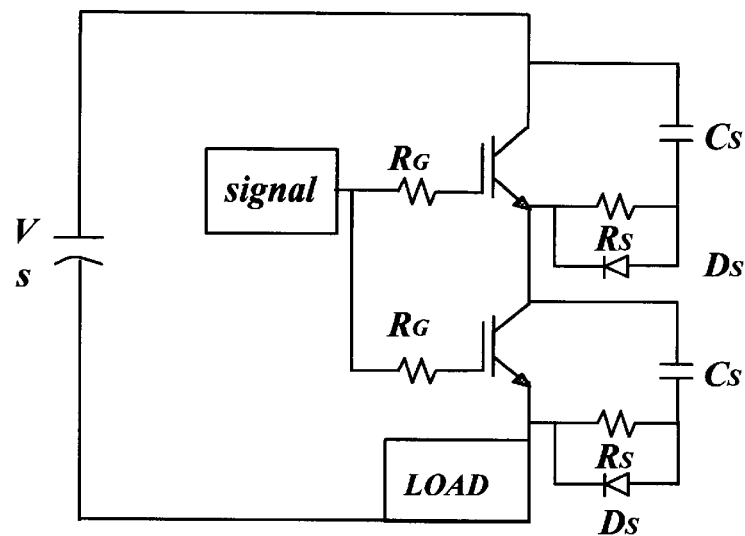
FIG. 1 shows series-connected power switches including a conventional passive snubber circuit.
Figure 2:
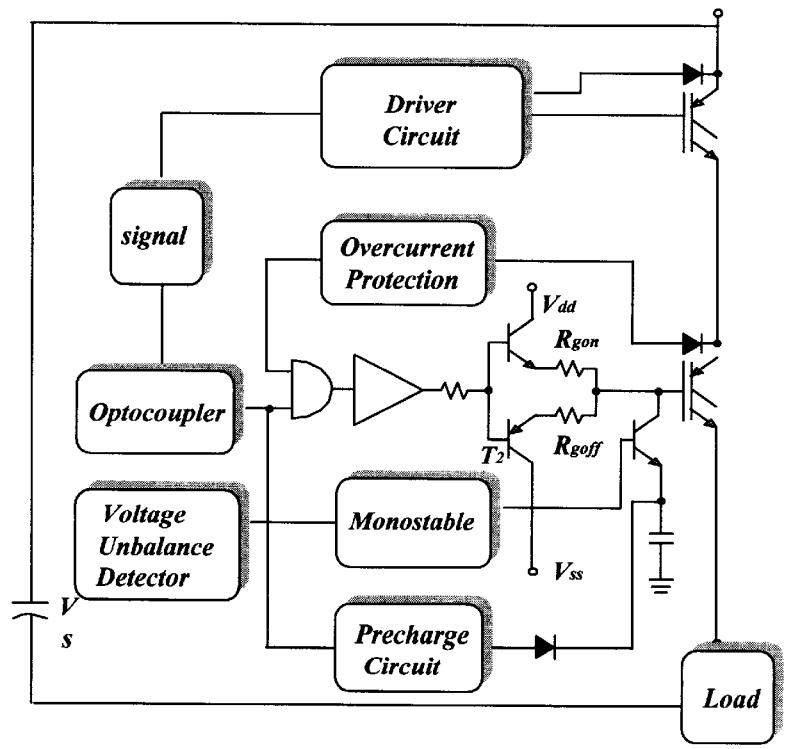
FIG. 2 shows series-connected power switches including a conventional active gate driving circuitry.
Figure 3:
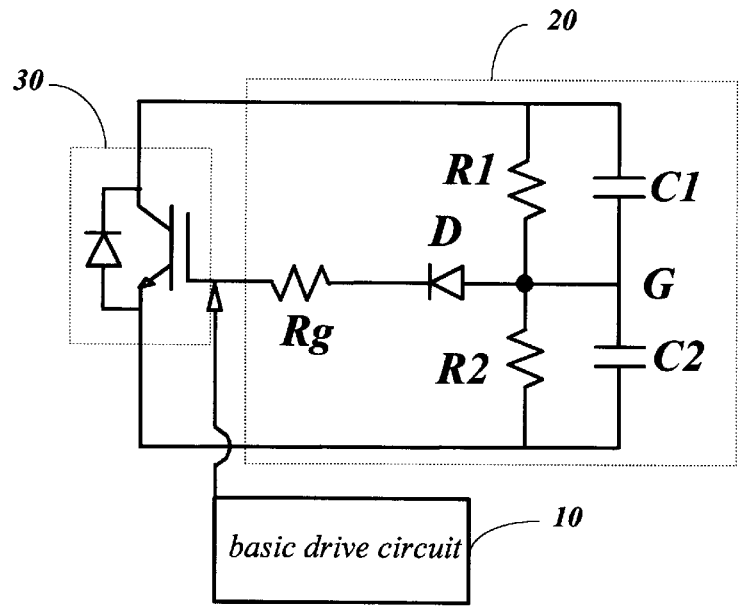
FIG. 3 shows a passive auxiliary circuit for series connection of a solid state power switch according to the present invention.

FIG. 3 shows a passive auxiliary circuit 20 for series connection of a solid state power switch according to the present invention. An IGBT 30 is included in the switching circuit of FIG. 3 as a solid state switching device. The passive auxiliary circuit 20 consists of two capacitors C1 and C2, three resistors R1, R2 and Rg, and one diode D. The two capacitors C1 and C2 are connected in series between a drain and a source terminal of the IGBT 30. Each of the two resistors R1 and R2 is connected in parallel with each of the two capacitors C1 and C2. The other resistor Rg and the diode D are connected in series between a gate terminal of the IGBT 30 and a common dividing point G, and the diode D is placed such that its cathode is directed to the gate of the IGBT 30.

It is preferable that the capacitance of the capacitor C1 and the resistance of the resistor R1 are much larger relatively to the capacitor C2 and the resistor R2. In the embodiment, the capacitance of the capacitor C1 is 100 [nF] whereas the capacitance of the other capacitor C2 is 10 [nF], and the resistor R1 is 30 [kΩ] whereas the resistor R2 is 3 [kΩ]. The diode adopted in the embodiment has the rating of 1000 [V] and 1 [A].

Figure 4A:
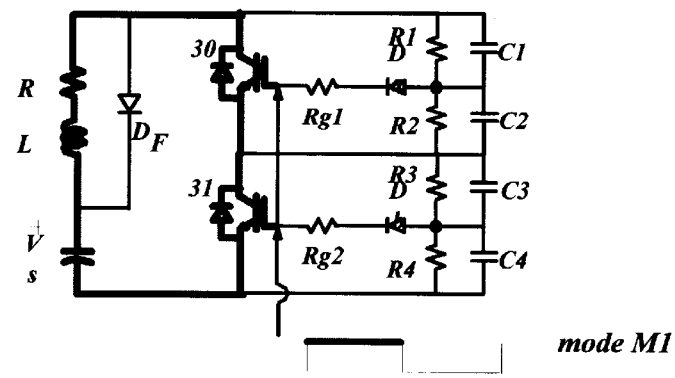
FIGS. 4A to 4D show operational circuit in associated with basic operational modes.
Figure 4B:
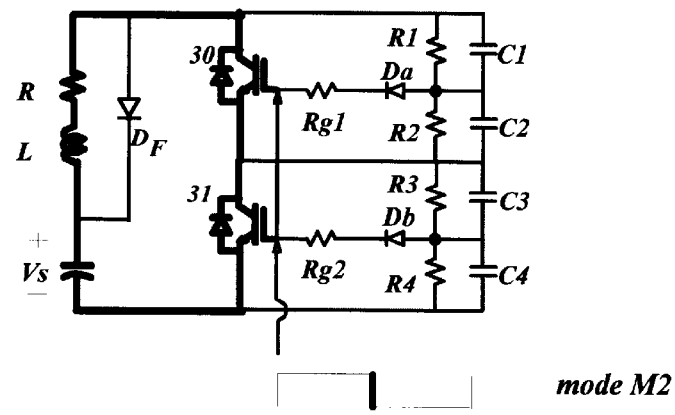
Figure 4C:
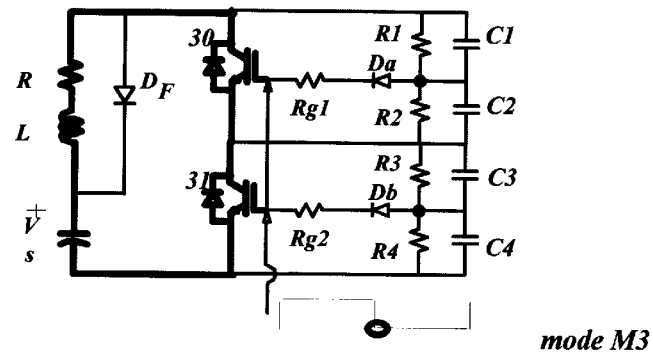
Figure 4D:
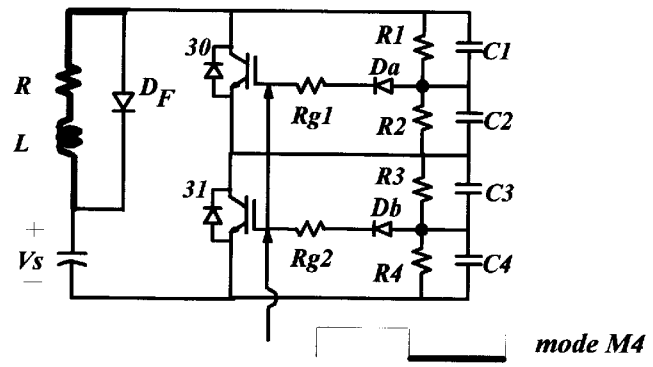
Figure 5:
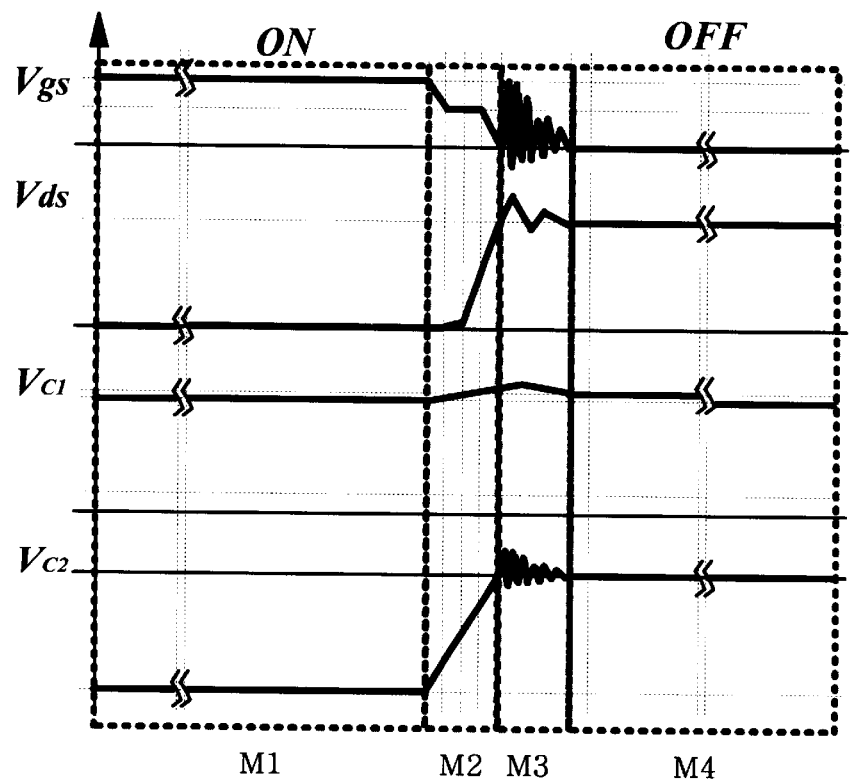
FIG. 5 shows waveforms at several concerning points of the circuit of FIG. 3 according to the operational modes classified as shown in FIGS. 4A to 4D.

FIGS. 4A to 4D shows several classified operational modes of the series-connected switching circuit of FIG. 3, and FIG. 5 shows waveforms at several concerning points according to the operational modes classified as shown in FIGS. 4A to 4D.

To simplify the explanation of the operational modes, it is assumed that all components of FIG. 3 are ideal so that parasitic components are all zero. The operation of the passive auxiliary circuit 20 is described in detail only for turn-off of the IGBT 30 since this operation is same with turn-on mode of the IGBT 30.

The switching circuit of FIG. 3 has a resistive and inductive load. Vs marked in FIGS. 4A to 4D and 5 is a supplied voltage, Vgs is a gate-source voltage of the IGBT 30, Vds is a drain-source voltage, Vc1 is a divided voltage applied across the capacitor C1, and Vc2 is a divided voltage across the capacitor C2.

FIG. 4A is the first mode M1 in which the IGBT 30 has been turned on by a driving voltage applied to the gate from a basic drive circuit 10. In the first mode M1, the voltage Vc2 across the capacitor C2 is charged up to a reverse voltage of Vc1 across the capacitor C1, and the diode Da which the reverse voltage is applied to blocks the reverse voltage from being applied to the gate of the IGBT 30. The divided voltage of the IGBT 30 is almost maintained by the capacitor C1 while small voltage is discharged through the resistor R1. The operation of IGBT 31 is same as that of the IGBT 30.

FIG. 4B is the second mode M2 in which the IGBTs 30 and 31 begin to turn off from the first mode M1 during the falling edge of the driving voltage from the basic drive circuit 10. In the second mode M2, The current flowing through the IGBTs 30 and 31 is decreased to zero gradually since the driving voltage Vgs is changed to negative. At the same time, the current not being able to flow through the IGBT 30 starts to flow through the two capacitors C1 and C2 while charging the capacitor C2 rapidly from negative to zero and the capacitor C1 up to the divided voltage of the IGBT 30. As a result, the voltage Vds between the drain and the source becomes Vc1+Vc2. In the case of IGBT 31, the operation of auxiliary circuit is same.

FIG. 4C is the third mode M3, in which, it is assumed an overvoltage is applied to only the IGBT 30 at the lowest point of falling edge of the driving voltage from the basic drive circuit 10.

Because the voltage of IGBT 31 is under the divided voltage, the voltage Vc2 maintained to zero. Therefore, the IGBT 31 becomes to turn-off state.

This mode M3 shows a noticeable feature of the present invention as follows.

In the third mode M3, the voltage Vds of the IGBT 30 is still increasing so that it exceeds the voltage Vc1 across the capacitor C1. The current still charging the capacitors C1 and C2 is decreased gradually. After the voltage Vds across the IGBT 30 is higher than the divided voltage, the capacitor C2 is charged to positive because the capacitance of C1 is much larger than that of C2. The positive voltage of Vc2 is then applied to the gate terminal of the IGBT 30, which causes to increase the gate voltage above zero and acts to turn on the IGBT 30 since the gate voltage is the sum of the driving voltage from the basic drive circuit 10 and the voltage across the capacitor C2. Therefore, the increasing rate of the voltage Vds across the IGBT 30 being turned off becomes smooth, thereby suppressing possible overvoltage across the IGBT 30.

FIG. 4D is the fourth mode M4 in which the IGBT 30 has been turned off after the suppressed overvoltage of Vds on turning off disappears completely. In this mode M4, the current through the IGBT 30 and the voltage Vc2 across the capacitor C2 is reduced to zero. The gate voltage Vgs returns to and keeps zero after its positive state caused by the overvoltage of Vds is totally released, so that the IGBT 30 is kept turned off stably. The voltage across the IGBT 30 turned off is divided by the resistors R1 and R2.

Figure 6:
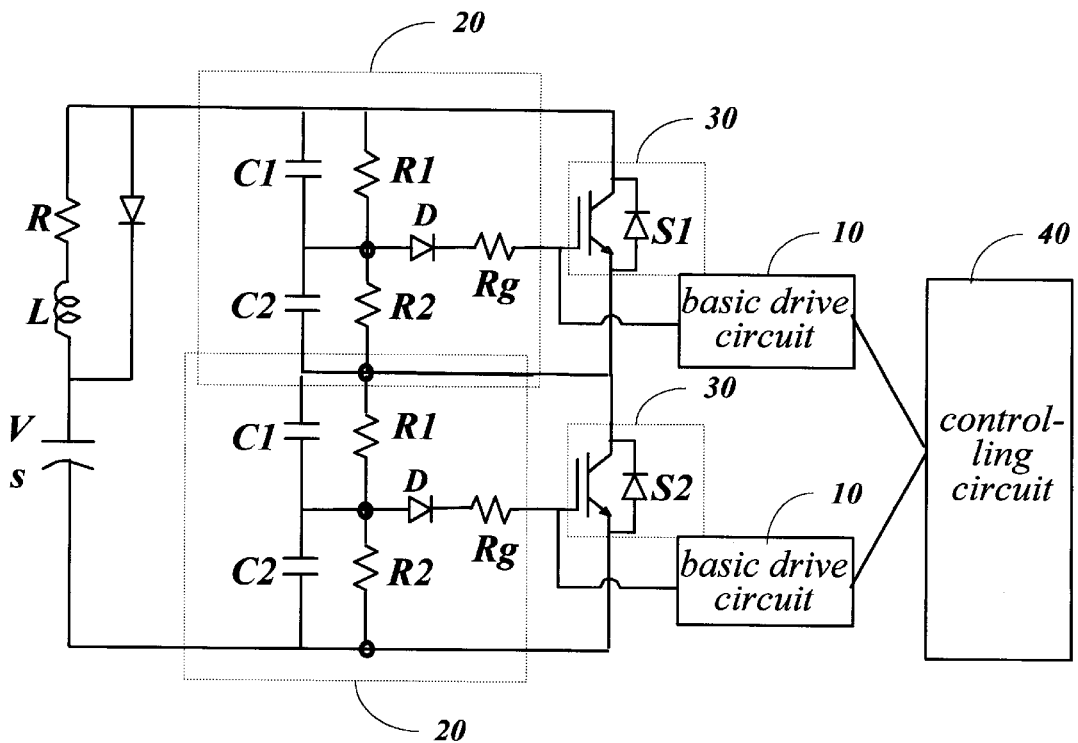

FIG. 6 shows a part of a power circuit including two series-connected solid state power switches S1 and 32 which the passive auxiliary circuits presented in FIG. 3 are added to. In the power circuit of FIG. 6, a load composed of a resistor R and an inductor L is connected to a supplying voltage Vs and is driven through two series-connected IGBT switches S1 and S2. Two passive auxiliary circuits 20 described in FIG. 3 are connected around each IGBT, and the two passive auxiliary circuits 20 are commonly connected at the connection point of the two switches S1 and S2. Two basic drive circuits 10 drive individual gate of each IGBT switch, and a controlling circuit 40 generates switch control signals to be applied to the two basic drive circuits 20.

Figure 7:
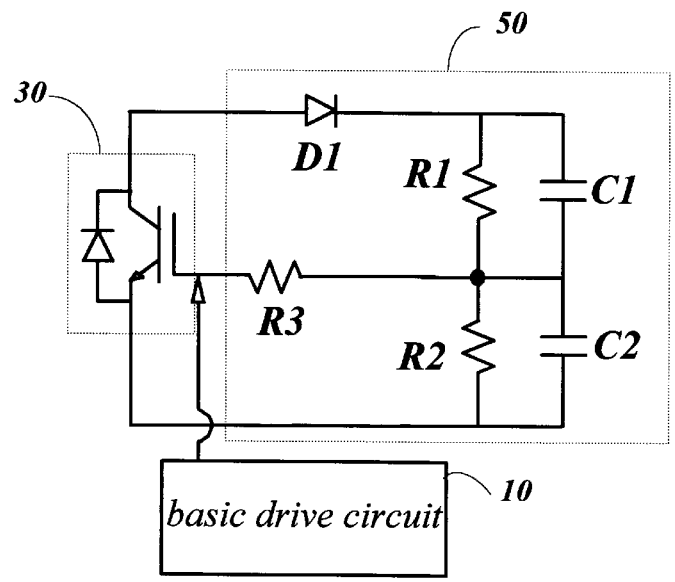
FIG. 7 is another passive auxiliary circuit for series connection of a solid state power switch according to the present invention.

FIG. 7 is another passive auxiliary circuit for series connection of a solid state power switch according to the present invention. The auxiliary circuit 50 presented in FIG. 7 is different from the circuit of FIG. 3 in that a diode D1 is inserted into branch between the drain of an IGBT 30 and the connecting node of the capacitor C1 and the resistor R1 instead of being connected to the gate terminal. The diode D1 is placed such that a freewheeling current can flow from the drain of the IGBT 30 to the connecting node.

In the auxiliary circuit 50 of FIG. 7, the diode D1 connected to the drain can prevent a bottom capacitor C2 from being charged in reverse and have the bottom capacitor C2 discharged to zero when the IGBT 30 is turned on. Other operations of the auxiliary circuit 50 is same with the circuit 20 presented in FIG. 3.

Figure 8:
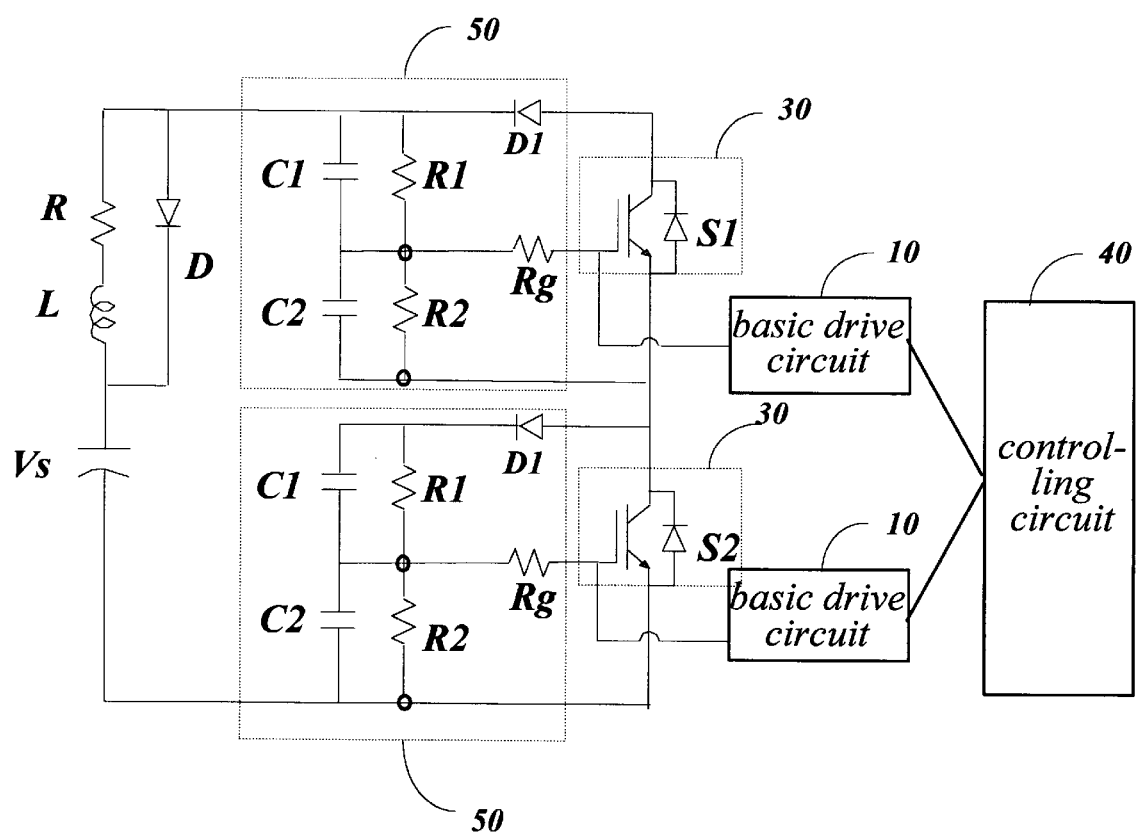

FIG. 8 shows a part of a power circuit including two series-connected solid state power switches S1 and S2 which the passive auxiliary circuits 50 presented in FIG. 7 are added to. In the power circuit of FIG. 8, a load composed of a resistor R and an inductor L is connected to a supplying voltage Vs and is driven through two series-connected IGBT switches S1 and S2. Two passive auxiliary circuits 50 described in FIG. 7 are connected around each IGBT, and the two passive auxiliary circuits 20 are commonly connected at the connection point of the two switches S1 and S2. Two basic drive circuits 10 and a controlling circuit 40 conduct same function as in the power circuit of FIG. 6.

The aforementioned auxiliary circuit is simply constructed by passive elements which have very small power rating compared with main IGBT switches. Especially, an additional loss, which is caused from discharge of the bottom capacitor C2 and power dissipation at the dividing resistors R1 and R2, is almost negligible. That is, the loss is remarkably reduced compared with a conventional auxiliary circuit including snubbers or clampers since the capacitance C2 is very small.

This passive auxiliary circuit operates similarly with a conventional active gate control method in the third mode M3 described in the above. Moreover, The slope of rising and falling edge of an IGBT is almost same as using a basic drive circuit since a fast transient response for overvoltage is achieved.

This auxiliary circuit guarantees switching frequency up to several tens kHz for a main switch with little loss, and enables several tens kV voltage to be applied across all series-connected switches since the auxiliary circuit is easily connected each other in stack.

Although the preferred embodiment of the present invention have been disclosed for illustrative purposes, those skilled in the art will appreciate that various modifications, additions and substitutions are possible, without departing from the scope and spirit of the invention as recited in the accompanying claims.

What is claimed is:

1. A passive circuit for series-connection of a semiconductor power switch, comprising:

two serial-connected capacitors connected in parallel with the power switch;

two resistors, each resistor being connected in parallel with each of the capacitors; and a diode and a third resistor which are connected in series between a driving terminal of the power switch and a node connecting the two capacitors, wherein the diode is placed such that its cathode is directed to the driving terminal.

2. The passive circuit set forth in claim 1, wherein the parallel-connected capacitor and resistor connected between a current inflow terminal and the node are much larger in capacitance and resistance than the parallel-connected capacitor and resistor connected between the node and a current outflow terminal of the power switch, respectively.

3. The passive circuit set forth in claim 2, wherein the parallel-connected capacitor and resistor connected between the current inflow terminal and the node are about ten times in capacitance and resistance as large as the parallel-connected capacitor and resistor connected between the node and the current outflow terminal of the power switch, respectively.

4. A passive circuit for series-connection of a semiconductor power switch, comprising:

two serial-connected capacitors connected in parallel with the power switch;

two resistors, each resistor being connected in parallel with each of the capacitors;

a third resistor connected between a driving terminal of the power switch and a node connecting the two capacitors; and a diode inserted into a branch between a current inflow terminal of the power switch and one of the capacitors, wherein the diode is placed such that its anode is directed to the current inflow terminal.

5. The passive circuit set forth in claim 4, wherein the parallel-connected capacitor and resistor connected between the current inflow terminal and the node are much larger in capacitance and resistance than the parallel-connected capacitor and resistor connected between the node and a current outflow terminal of the power switch, respectively.

6. The passive circuit set forth in claim 5, wherein the parallel-connected capacitor and resistor connected between the current inflow terminal and the node are about ten times in capacitance and resistance as large as the parallel-connected capacitor and resistor connected between the node and the current outflow terminal of the power switch, respectively.

* * * * *